United States Patent [19]
Godinho et al.

[11] Patent Number: 5,166,771
[45] Date of Patent: Nov. 24, 1992

[54] SELF-ALIGNING CONTACT AND INTERCONNECT STRUCTURE

[75] Inventors: Norman Godinho, Los Altos Hills; Frank T. Lee, Monte Sereno; Hsiang-Wen Chen, Cupertino; Richard F. Motta, Los Altos; Juine-Kai Tsang, Palo Alto; Joseph Tzou, Belmont; Jai-man Baik, San Jose; Ting-Pwu Yen, Fremont, all of Calif.

[73] Assignee: Paradigm Technology, Inc., San Jose, Calif.

[21] Appl. No.: 464,496

[22] Filed: Jan. 12, 1990

[51] Int. Cl.$^5$ .................. H01L 21/283; H01L 21/88
[52] U.S. Cl. .................................. 257/368; 257/387; 257/754; 257/760
[58] Field of Search .............. 357/41, 23.11, 23.9, 357/68, 65; 437/200, 41, 59

[56] References Cited

U.S. PATENT DOCUMENTS

| | | | |
|---|---|---|---|
| 4,103,415 | 8/1978 | Hayes . | |
| 4,325,169 | 4/1982 | Ponder et al. | 437/49 |
| 4,466,172 | 8/1984 | Batra . | |
| 4,466,176 | 8/1984 | Temple | 357/23.9 |
| 4,470,852 | 9/1984 | Ellsworth | 437/34 |
| 4,635,347 | 1/1987 | Lien et al. | 437/200 |
| 4,746,219 | 5/1988 | Holloway et al. . | |
| 4,772,571 | 9/1988 | Scovell et al. . | |
| 4,774,204 | 9/1988 | Havemann | 437/54 |
| 4,810,666 | 3/1989 | Taji . | |
| 4,822,749 | 4/1989 | Flanner et al. | 437/41 |
| 4,851,361 | 7/1989 | Schumann et al. | 437/30 |
| 4,855,798 | 8/1989 | Imamura et al. | 357/71 |
| 4,868,138 | 9/1989 | Chan et al. | 437/41 |
| 4,873,204 | 10/1989 | Wong et al. | 437/193 |
| 4,877,755 | 10/1989 | Rodder | 437/41 |
| 4,882,297 | 11/1989 | Blossfeld | 437/33 |
| 4,920,073 | 4/1990 | Wei et al. | 437/200 |
| 4,937,657 | 6/1990 | DeBlasi et al. | 437/200 |
| 4,978,637 | 12/1990 | Liou et al. | 437/200 |
| 4,980,020 | 12/1990 | Douglas | 357/23.6 |
| 4,985,744 | 1/1991 | Spratt et al. | 357/23.9 |

FOREIGN PATENT DOCUMENTS

| | | |
|---|---|---|
| 59-175162 | 10/1983 | Japan . |
| 61-248472 | 11/1986 | Japan . |
| 62-219558 | 9/1987 | Japan . |
| 1-57671 | 3/1989 | Japan . |
| WO89/11732 | 11/1989 | PCT Int'l Appl. . |

*Primary Examiner*—Andrew J. James
*Assistant Examiner*—Viet Q. Nguyen
*Attorney, Agent, or Firm*—Skjerven, Morrill, MacPherson, Franklin & Friel

[57] ABSTRACT

An MOS transistor for use in an integrated circuit, particularly CMOS integrated circuits, is fabricated with a self-aligning contact and interconnect structure which allows for higher packing density. Self-aligning source and drain contacts overlap the gate but are prevented from short circuiting to the gate by oxide insulation between source/drain contacts and the gate, and a layer of silicon nitride above the gate. Contacts to the gate are made on top of the gate over the active region of the transistor because the source and drain regions are protected by a hardened layer of photoresist during etching of insulation to expose the gate contact. Source, drain and gate contacts are protected by a layer of titanium silicide so that interconnects are not required to completely cover these areas. Low resistance interconnects are formed of titanium silicide encapsulated by a thin film of titanium nitride.

25 Claims, 9 Drawing Sheets

70 SILI
 74 BCONT
 78 METAL1

73 POLYISO
 77 CONTACT

72 POLYI
 76 LOAD

71 ISLAND
 75 LOADVIA

SELF-ALIGNING CONTACT AND INTERCONNECT STRUCTURE

RELATED APPLICATION

This application is related to and incorporates by reference application Ser. No. 07/464,094 filed the same day as this application. This copending application is also filed by Norm Godinho, Frank Tsu-Wei Lee, Hsiang-Wen Chen, Richard F. Motta, Juine-Kai Tsang, Joseph Tzou, Jai-man Baik, and Ting-Pwu Yen entitled "High Resistance Polysilicon Load Resistor," and is assigned to Paradigm Technology Corporation, the assignee of this application.

FIELD OF THE INVENTION

This invention relates to a self-aligning contact and interconnect structure, and method for making the same, for use in integrated circuits and particularly in CMOS integrated circuits which has broad applicability in both memory and logic products.

BACKGROUND OF THE INVENTION

An MOS transistor includes a source region, a drain region and a channel region therebetween. In the prior art, electrical contacts to the source and drain regions must be sufficiently spaced from the gate of the transistor to ensure that the source, drain and gate remain electrically isolated when manufacturing tolerances are taken into account. The spacings between the contacts to the source and drain regions, on the one hand, and to the gate on the other hand, are a function of the alignment and critical dimensions such that under worst case manufacturing tolerances, the contacts do not touch the polysilicon gate. Consequently, the surface area of each MOS transistor must be larger than required by the size of the source, drain and gate regions.

A previous method of establishing self-aligned contacts involved oxidizing the polycrystalline silicon gate at a high temperature to provide insulation between the contacts and the gate. Such an approach has been disclosed by J. A. Hayes in U.S. Pat. No. 4,103,415, issued Aug. 1, 1978. However, the temperatures associated with forming oxidation barriers cause diffusion of the dopants in the source and drain regions. This diffusion changes the dimensions of the source and drain regions and thus prevents this approach from being used when integrated circuits are fabricated using one micron and sub-micron fine line geometries. In addition, high temperature oxidation according to prior art self-aligning contact schemes causes oxide to grow along the outer edge of the interface between the gate and the gate oxide, effectively increasing the thickness of the gate oxide in that area. Consequently, the threshold voltage of the transistor will be higher along the edge of the gate than along its center. Thus, the current drive of the transistor will be significantly reduced. Accordingly, there has been need for a new contact structure which would allow the size of the transistors, and therefore the size of memory cells using these transistors, to be reduced.

In an integrated circuit the contacts are usually connected to electrical interconnections or "interconnects" to form an integrated circuit. Interconnects have often been formed using heavily doped polycrystalline silicon (i.e. "polysilicon") layers; however, these layers typically have a sheet resistance of 20 ohms per square or higher. Resistance this high causes long RC time constants and hence, undesirable time delays.

When forming an interconnect layer according to the prior art, the polysilicon interconnect layer is required to overlap all the source, drain and polysilicon contacts so that even in the event of worst case alignment, contacts are not exposed. Such exposure will cause the underlying polysilicon gate and the doped source and drain regions to be damaged during etching of the polysilicon interconnect layer. This alignment requirement of the polysilicon interconnect layer consumes a significant amount of space, particularly in memory cells. Accordingly, there has been a need for low resistance interconnects that are not required to completely overlap the source, drain and polysilicon contacts.

SUMMARY OF THE INVENTION

In accordance with this invention, a self-aligned contact structure is provided which allows for higher packing density (i.e. more transistors per unit area) of integrated circuits compared to the prior art without forcing the production process to finer line geometries and higher costs. The self-aligning structure of this invention is universally applicable to MOS memory and logic integrated circuits and is particularly useful in static random access memory (SRAM) cells which require as many as five contacts per cell.

The self-aligning source and drain contacts in one embodiment of this invention overlap the gate electrode and yet do not cause a short circuit between the source and drain on the one hand and the gate on the other hand. This overlapping also allows for a looser alignment tolerance requirement in the photolithographic operations by which the CMOS transistor is made and provides a transistor approximately 30% smaller in size than in the prior art. The overlapping is permissible due to insulation between the gate and the source-drain contacts. The insulation, in one embodiment, is formed of silicon nitride and silicon dioxide. The silicon dioxide layer is formed by low temperature chemical vapor deposition at 350°–400° C. rather than thermally grown at higher temperatures. After the source and drain regions are formed, a minimum of high temperature processes are used, thereby avoiding significant diffusion of dopants in those regions.

In accordance with this invention, contacts to the polysilicon gate can be made on top of the gate region over the active channel because the source and drain regions are protected by a hardened layer of photoresist during etching of the insulation to expose the gate contact. This allows a reduction in the size of the field of the device which saves valuable silicon area and allows a higher packing density to be obtained in a given integrated circuit. Considerable space is saved in the vertical direction by forming contacts to the gate region over the active portion of the transistor rather than on top of the thicker field oxide. Furthermore, the contact size of the mask can extend beyond the polysilicon gate, permitting a looser alignment tolerance in the manufacturing process while at the same time achieving, somewhat paradoxically, a smaller transistor area.

In one embodiment of this invention a layer of titanium silicide covered by a thin film of titanium nitride is formed on the exposed source, drain and polysilicon gate contacts. The silicided areas are formed only in selected locations. Interconnects formed from the first deposited layer of polysilicon, (the layer from which the gate is formed) and usually located in the periphery of a memory array, are converted to titanium silicide encapsulated by a thin layer of titanium nitride to create low resistance interconnects. The low sheet resistance of the silicided interconnects, typically 3-5 ohms per square, reduces the RC time constant, and hence, the propagation time delay compared to the prior art.

A second layer of polysilicon is deposited and defined to form local interconnects. The etchant used to define the local interconnects will not attack the exposed underlying silicided source, drain and gate contacts and interconnects. Therefore, the polysilicon local interconnect layer is not required to completely cover and protect the source, drain and gate contacts and interconnects, permitting a looser alignment tolerance and saving significant space, particularly in a memory cell.

After the polysilicon local interconnects are defined, they are converted to titanium silicide encapsulated by a thin film of titanium nitride. Titanium nitride is a good electrical conductor but is a barrier to dopant diffusion.

The silicide interconnect layer can cross over the polysilicon gate as well as the N and P doped regions and be isolated from them. The silicided interconnect can also contact either N or P doped areas as well as silicided polysilicon above the gate or field region, thus allowing for a very flexible local interconnect system.

DETAILED DESCRIPTION OF THE INVENTION

Figure 1:
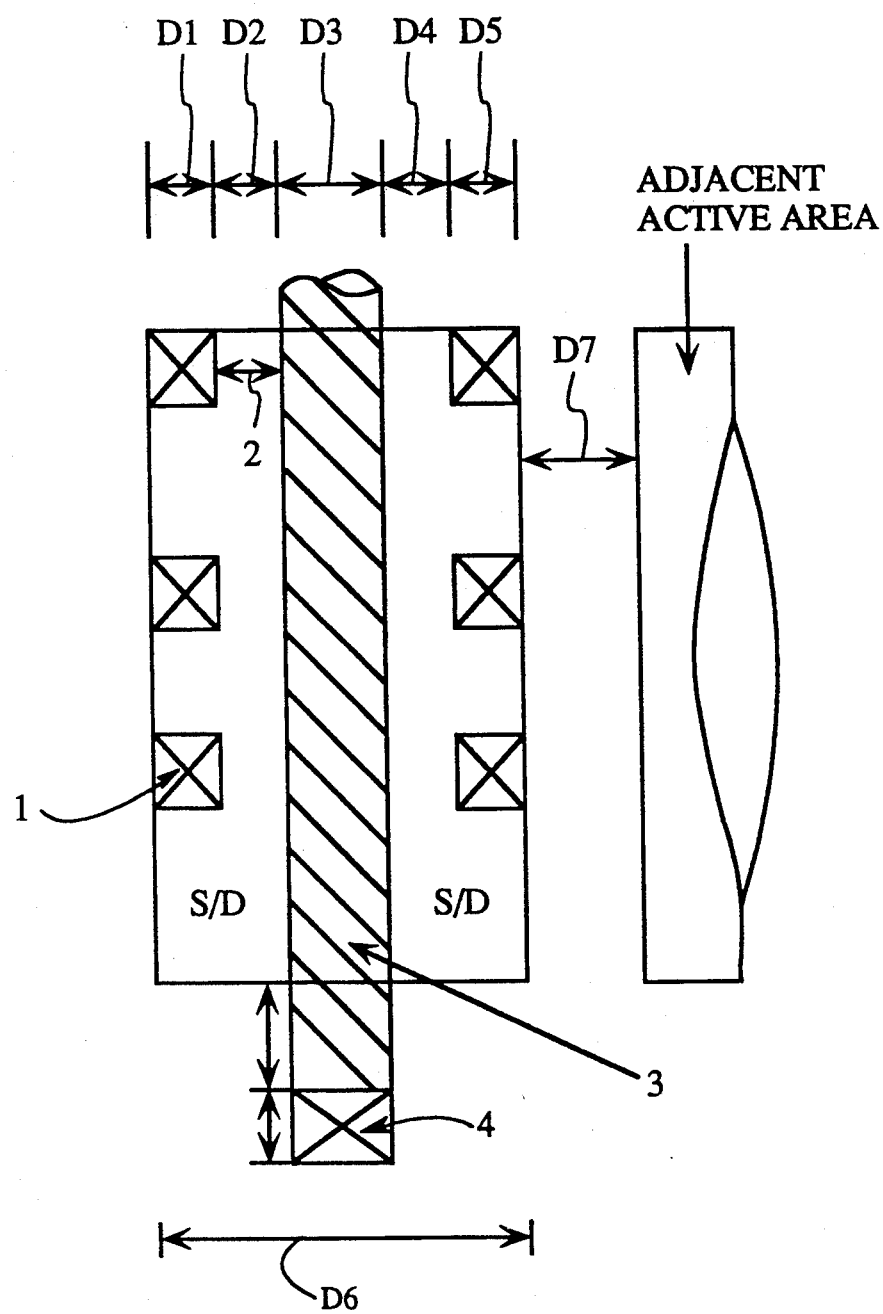
FIG. 1 is a plan view of a conventional MOS transistor structure with contacts formed as in the prior art.
Figure 2:
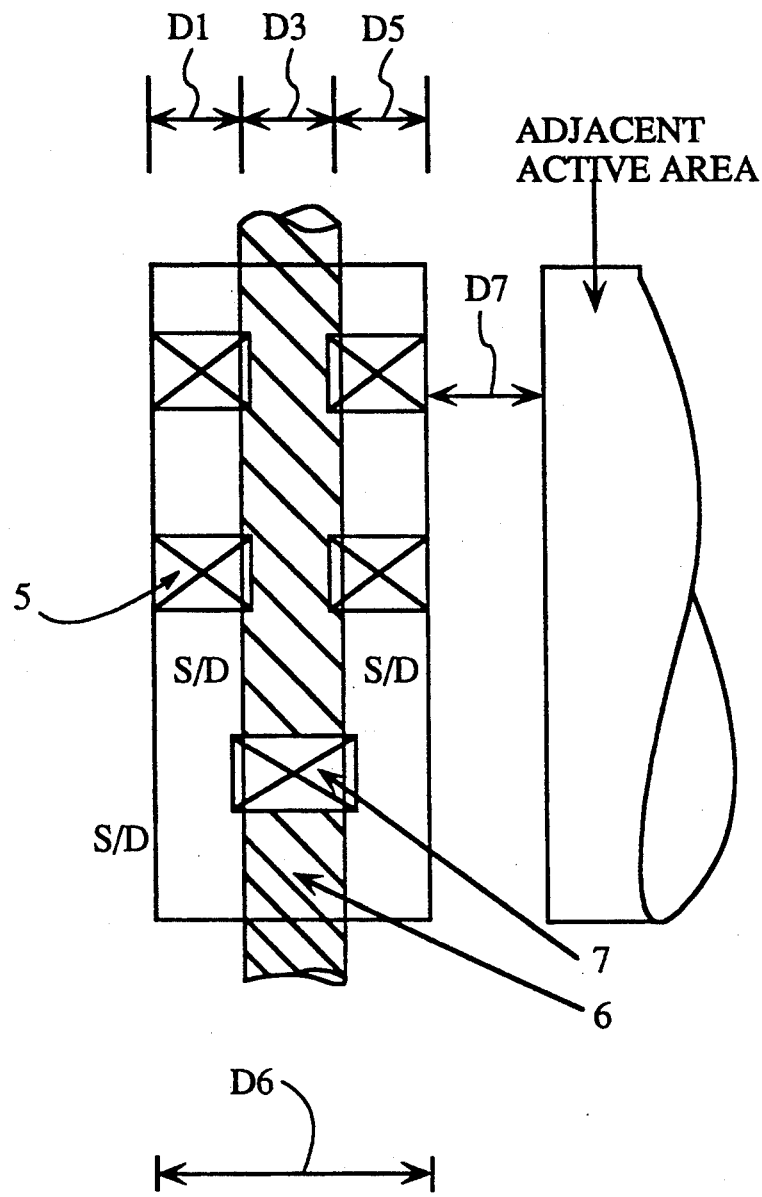
FIG. 2 is a plan view of a MOS transistor structure formed with self-aligning contacts according to this invention.

FIG. 1 illustrates in plan view a prior art MOS transistor having non-self-aligned source/drain contacts 1 and gate contact 4. Using state of the art steppers, the space 2 which assures that the source/drain contacts 1 do not touch the gate 3 is typically 0.8 microns. Thus, using one micron layout rules, the transistor pitch in the x-direction is 5.6 microns. The reduction in transistor size that can be achieved according to this invention is illustrated in FIG. 2. The self-aligning source/drain contacts 5 can be made to overlap the gate 6. Thus, using one micron layout rules, the transistor pitch in the x-direction is 4 microns, approximately 30% smaller than the prior art.

Referring again to FIG. 1, in the prior art, contacts, such as contact 4, to the polysilicon gate are typically allowed only in the field region, spaced 0.8 microns away from the active region in order to avoid shorts to the source and drain regions due to worst case misalignment of masks during the manufacturing process. As illustrated in FIG. 2, the self-aligning gate contacts 7 of this invention can be made on top of the active region, saving considerable space.

Figure 3A:
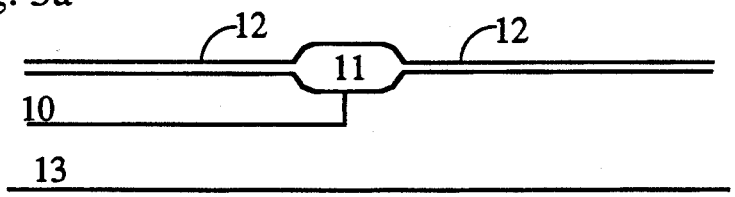
FIGS. 3a through 3k are simplified cross-sectional views of one embodiment of the invention during various steps of fabrication.

Referring to FIG. 3a, the method of forming a MOS field effect transistor of a CMOS integrated circuit according to this invention begins using well-known techniques to form N and P wells 10, and field and gate oxidation areas 11 and 12 respectively on doped silicon substrate 13. Gate oxide 12 is typically 180 Å thick.

Figure 3B:
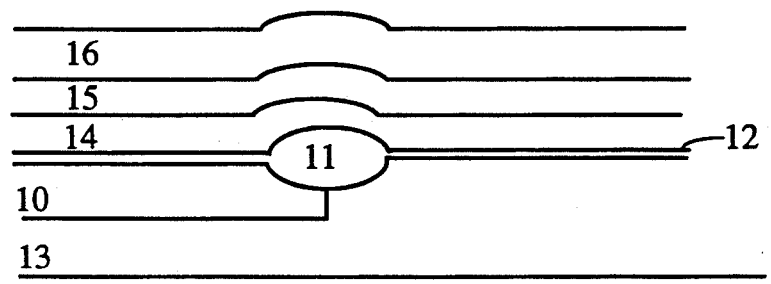

Referring to FIG. 3b, a layer 14 of polysilicon about 3000 Å thick is formed by low pressure chemical vapor deposition (LPCVD) and doped typically by diffusion, with N-type impurities to achieve a suitable sheet resistance, typically 50 ohms per square. The doped polysilicon will function as a gate in the complete MOSFET device. First level interconnects, (not shown) usually located in the periphery of a memory array, can also be formed from this layer of polysilicon. Next a thin, 150 Å oxide layer 15 is thermally grown on the polysilicon. A layer 16 of silicon nitride about 1800 Å thick is next formed on oxide layer 15 by LPCVD.

Figure 3C:
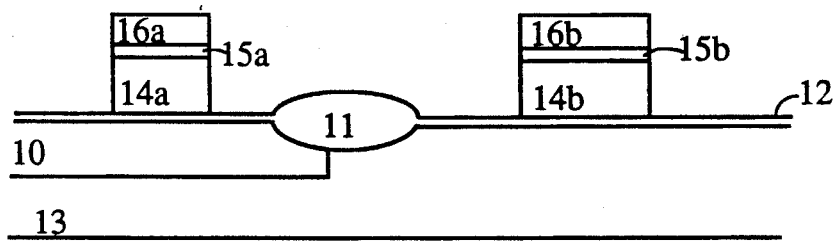

Referring to FIG. 3c, the polysilicon gates 14a, 14b are defined by well-known photo-masking and sandwich etching techniques. The sandwich etch is carried out in a LAM 490. The anisotropic sandwich etch includes a $SF_6$ plasma etch of the silicon nitride layer 16 and silicon oxide layer 15 and a subsequent anisotropic $Cl_2$/He plasma etch of the polysilicon to form polysilicon gates 14a and 14b covered by layers 15a, 15b and 16a, 16b.

Figure 3D:
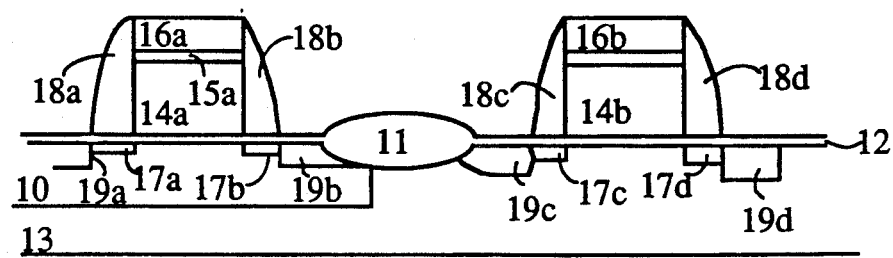

Well known ion implantation techniques are next used to form both N- and P- type lightly doped drain (LDD) implants 17a, 17b, 17c, 17d (FIG. 3d) so that the LDD implants have a conductivity type that is opposite to that of the well 10 or the substrate 13 if no well is present. Typically, the impurity concentration of the LDD implants is about $1.8 \times 10^{13}$ dopant atoms per cubic centimeter. Chemical vapor deposition of a silicon oxide layer using TEOS (tetraethylorthosilicate (ethyl silicate)) at approximately 350°-400° C. followed by reactive ion etching forms gate sidewall spacers 18a, 18b, 18c, 18d of silicon dioxide which are approximately 4000-4200 Å thick. A layer of oxide 100 Å thick (not shown) is thermally grown at approximately 800° C. to cap the source and drain regions and to densify the spacer oxide 18a-18d. N+and P+type source and drain regions 19a, 19b, 19c, 19d are then formed by well known masked ion implantation so that the dopant concentration is typically $3 \times 10^{15} - 5 \times 10^{15}$ dopant atoms per cubic centimeter in these regions.

Figure 3E:
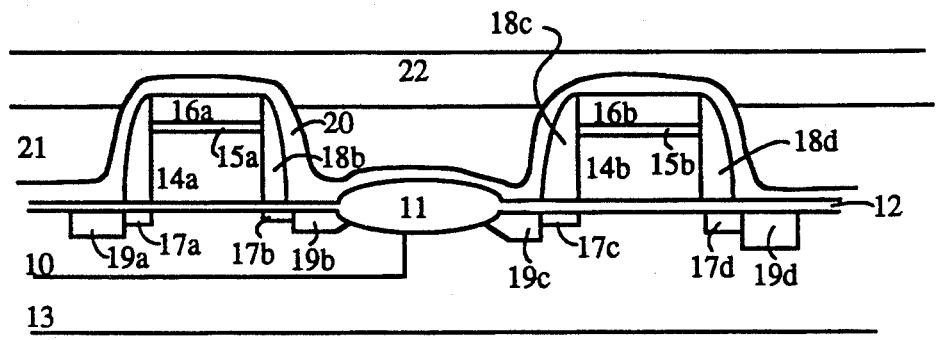

Gate contact regions are defined as described below. Referring to FIG. 3e, chemical vapor deposition of a silicon oxide layer 20, 1100 Å thick, is followed by annealing of the layer at 875° C. for 30 minutes in a nitrogen atmosphere.

The wafer is then coated with a standard Novolak based positive photoresist available from Shipley which tends to planarize the wafer, and is then baked. The photoresist 21 is blanket etched by oxygen plasma in plasma etcher AME 8115 until the oxide 20 covering the gate region is visible. A second bake of resist layer 21 at 150° C. for approximately 30 minutes hardens the resist 21 and makes it unreactive in subsequent steps. A second layer of the same positive photoresist 22, to be used with a dark field mask, is applied over the first layer 21.

Figure 3F:
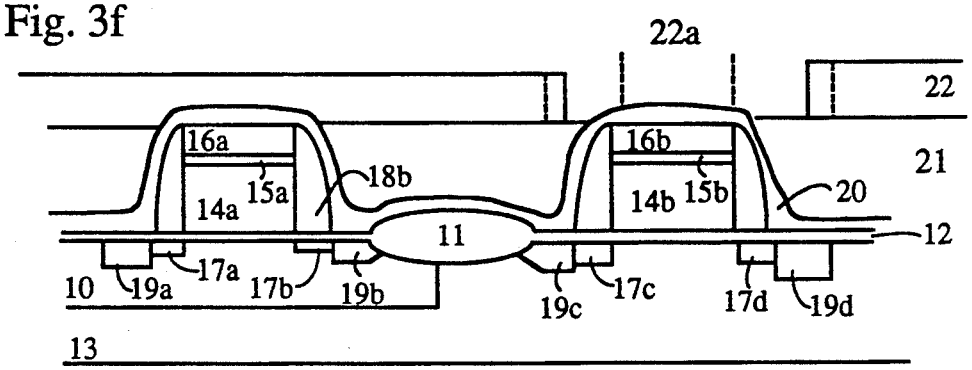

Next an opening is formed through oxide 20, nitride 16b and oxide 15b to allow electrical contact to be made to gate 14b. The polysilicon isolation mask used for this purpose to expose the gate 14b can have a contact size extending beyond the gate, thereby permitting a looser alignment tolerance. An approximation of the variable position of the contact opening to gate 14a due to alignment tolerances for the mask is shown by the dashed lines in FIG. 3f. The presence of the first photoresist layer 21 prevents exposure of the source and drain regions 19c, a during etching of the oxide layers 20 and 15b and silicon nitride layer 16b to expose the gate 14b, even in the event of worst case alignment of the mask. In this way electrical contact to the gate 14b can be made over the active channel region of the transistor under gate 14b without causing a short circuit between the source or drain 19c, d and the gate 14b.

Figure 3G:
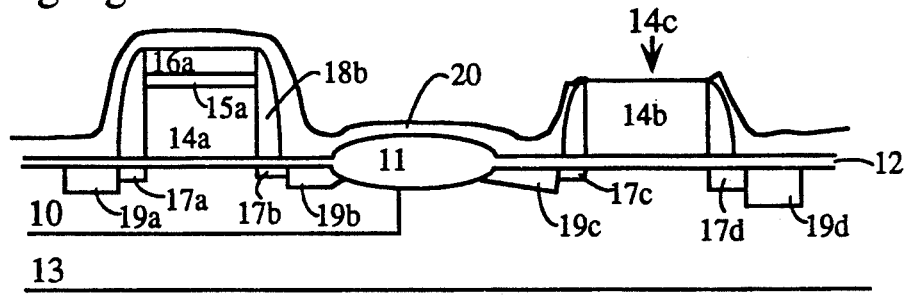

A multi-step etch is conducted to expose the gate contact. First, the oxide 20 is removed in the area exposed by the opening 22a in resist layer 22 with a dry plasma etch using $C_2F_6/CHF_3$ in a 25:12 ratio. Secondly, 1200–1500 Å of the silicon nitride layer 16b is removed by a $CF_4$ plasma etch. However, $CF_4$ etches all exposed materials at approximately the same rate to help create a smooth profile above gate 14b and causes a step in the oxide 18c, 18d at the interface of the oxide 18c, 18d and the first layer 21 of photoresist. Next, complete removal of both photoresist layers 21, 22 is followed by a standard wet phosphoric acid etch with a 50 to 1 selectivity toward silicon oxide (i.e., phosphoric acid etches silicon nitride fifty times more rapidly than silicon oxide) which removes the remainder of nitride layer 16b. Finally, a blanket $CF_4$ plasma etch removes 150 Å thick oxide layer 15b and decreases the height of the oxide step in oxide 18c, 18d on the sides of gate 14b to produce the polysilicon gate contact 14c shown in FIG. 3g. A process using only dry etchants for exposing the gate contact is also feasible.

Figure 3H:
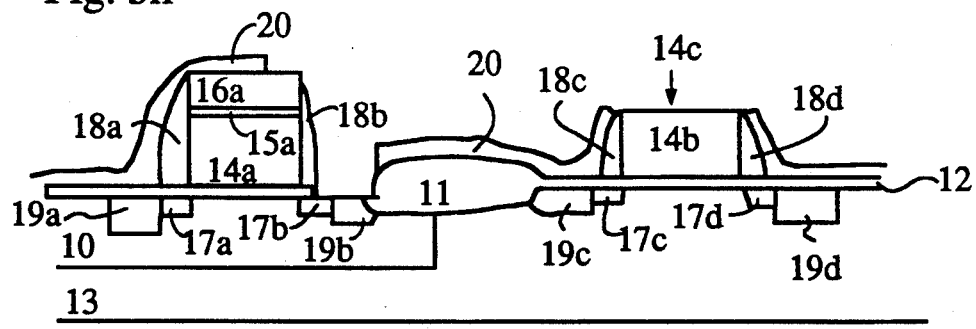

Referring to FIG. 3h, contacts to the source and drain regions are defined using a buried contact mask. A 1:1 $C_2F_6/CHF_3$ plasma etch of the oxide 20 removes only 10 to 20% of spacer oxide 18a, 18b because spacer oxide 18a, 18b is significantly thicker than oxide 20. The silicon nitride layer 16a protects the gate 14a after some portion of the oxide 20 covering the gate is removed. With spacer oxide 18a, 18b and protective silicon nitride layer 16a intact on gate 14a, source and drain contact metallization deposited later can overlap the gate without causing a short circuit between the source and drain 19b and the gate 14a.

The plasma oxide etch is followed by a backside etch which exposes pure silicon on the back side of the substrate 10. This exposure allows the temperature of the substrate 10 to be more closely monitored and controlled in subsequent processing steps. The backside etch is conducted in three steps the first step using a 12:8 ratio of $CHF_3/SF_6$ in helium is followed by a second step using only $SF_6$ in helium. The third step uses 20:8 $CHF_3/SF_6$, also in helium.

Figure 3I:
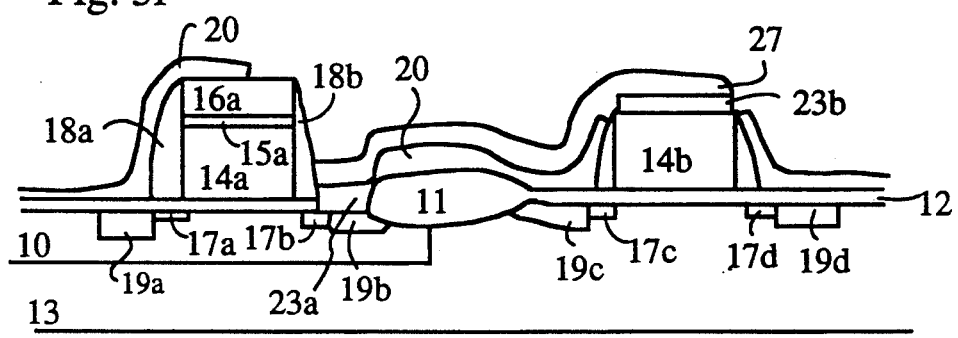

Referring to FIG. 3i, the silicon exposed by the source, drain and polysilicon gate contacts and the interconnects (not shown) are silicided by depositing a layer of sputtered titanium about 700 Å thick and using rapid thermal annealing at 700° C. in a $N_2$ atmosphere to form a layer of TiSi coated by a thin layer of titanium nitride. The rapid thermal annealing process involves quickly heating the substrate to a predetermined temperature, holding the substrate at that temperature for 30 seconds and then returning it to its original temperature. The substrate can reach the predetermined temperature as quickly as 15 seconds. The rapid thermal annealing apparatus typically used is available from PEAK SYSTEMS, model ALP-5500. The unreacted titanium is stripped from the substrate's surface with a 5:1:1 solution of water, hydrogen peroxide and ammonium hydroxide which also attacks and removes the titanium nitride layer. A second rapid thermal annealing step at 900° C. for 30 seconds in an atmosphere of ammonia converts the TiSi to the stable silicide $TiSi_2$ layer 23a, 23b, coated by a thin layer of titanium nitride (not shown). In this way, areas of titanium silicide are selectively formed. For instance, the gate is silicided only at regions which will contact the subsequently formed local interconnects because these are the only gate regions exposed by previous processing steps.

Of importance, the silicided layer 23a, 23b can protect the underlying source, drain and gate regions and the interconnects during later processing steps, particularly the formation of local interconnects to be formed from a second polysilicon layer.

Local interconnects are formed from a second layer of polysilicon about 700 Å thick which is deposited by LPCVD in a well-known manner. However, before the wafers are inserted into the reactor, the reactor temperature is lowered to 150° C. The reactor chamber is evacuated and backfilled with an inert gas before the temperature is raised so as to lessen the wafers' contact with oxygen at high temperatures. Well-known masking and etching processes define the local interconnects. Use of an isotropic $SF_6/O_2$ plasma etch diminishes the necessity of overetch. Because the etch is selective to titanium silicide, the underlying titanium silicide layer 23a, 23b prevents damage to the source, drain and gate contacts and the first layer interconnects formed from the first polysilicon layer during the etch, therefore, the local interconnects are not required to completely overlap these regions. Layer 23 also acts as an etch stop so that the etchant will not remove the polysilicon gate or first layer interconnects during overetching of the local interconnects.

Next a 500 Å layer of sputtered titanium is deposited on the substrate. Rapid thermal annealing at 640° C. in a nitrogen atmosphere for 60 seconds forms titanium silicide $TiSi_x$ local interconnects 27 encapsulated by a thin titanium nitride film. The unreacted titanium and the titanium nitride film are stripped from the surface with a solution of 5:1:1 water, hydrogen peroxide and ammonium hydroxide to give the structure shown in FIG. 3i.

Figure 3J:
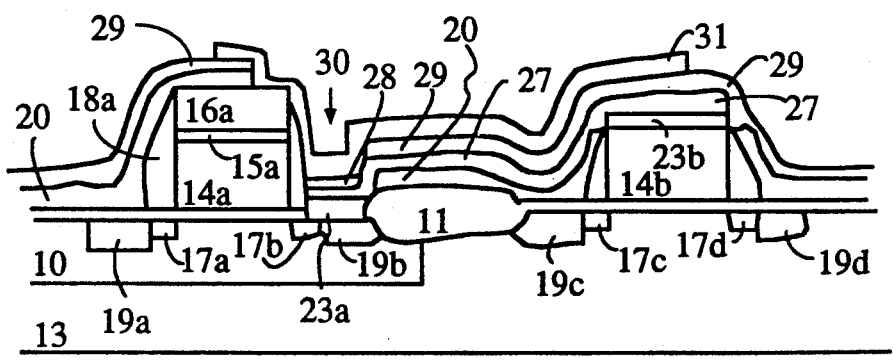

Referring to FIG. 3j, a 500 Å thick layer of oxide is deposited from a mixture of silane, nitrous oxide and nitrogen at approximately 400° C. to act as an isolation layer 29. Masking and a standard $CHF_3/O_2$ plasma oxide etch are used to open load resistor vias 30 to selected regions of local interconnects 27. Rapid thermal annealing at 850° C. for 3–0 seconds in a nitrogen atmosphere converts the $TiSi_x$ of the local interconnects to $TiSi_2$ to create low resistance interconnects. A thin titanium nitride film 28 forms on the regions of the local interconnects exposed by vias 30. Titanium nitride is a good electrical conductor but a barrier to dopant diffusion. This barrier will prevent dopants from diffusing into the polysilicon resistors formed by subsequent processing steps.

A third layer of polysilicon 700 Å thick, which will constitute the resistors, is deposited in a well-known manner by LPCVD. Masking and etching again using an isotropic $SF_6/O_2$ plasma etch define resistors 31 as shown in FIG. 3j. Dopant implantation to reduce the resistance of the resistors is possible.

Figure 3K:
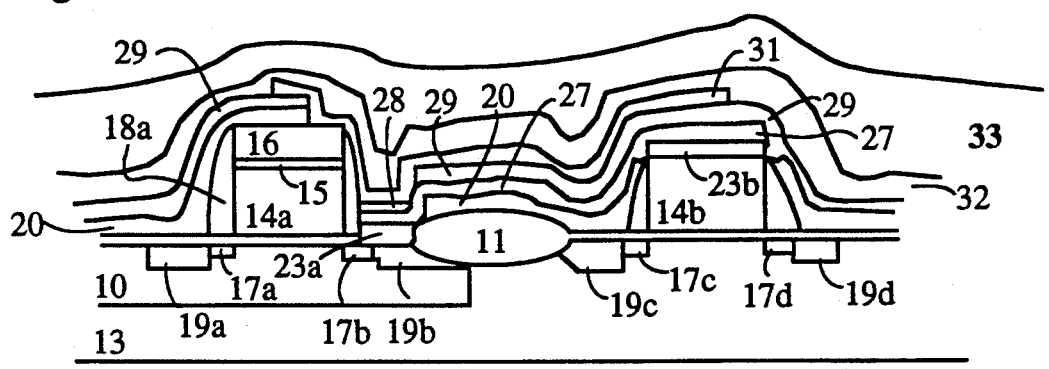

Referring to FIG. 3k, a layer 32 of oxide 1200–1500 Å thick is deposited from a mixture of silane, nitrous oxide is deposited from a mixture of silane, nitrous oxide and nitrogen at approximately 400° C. A doped boron-phosphorous glass 33 which acts as an insulation layer is deposited over oxide 32 in a manner similar to oxide 32 but with the addition of diborane and phosphine to the starting gases. The glass 33 is flowed at 800° C. for 30 minutes to form a more level surface. Oxide layer 32 prevents diffusion of boron and phosphorus from boron-phosphorus glass 33 to resistors 31.

Standard fabrication techniques are used to complete the product.

Figure 4A:
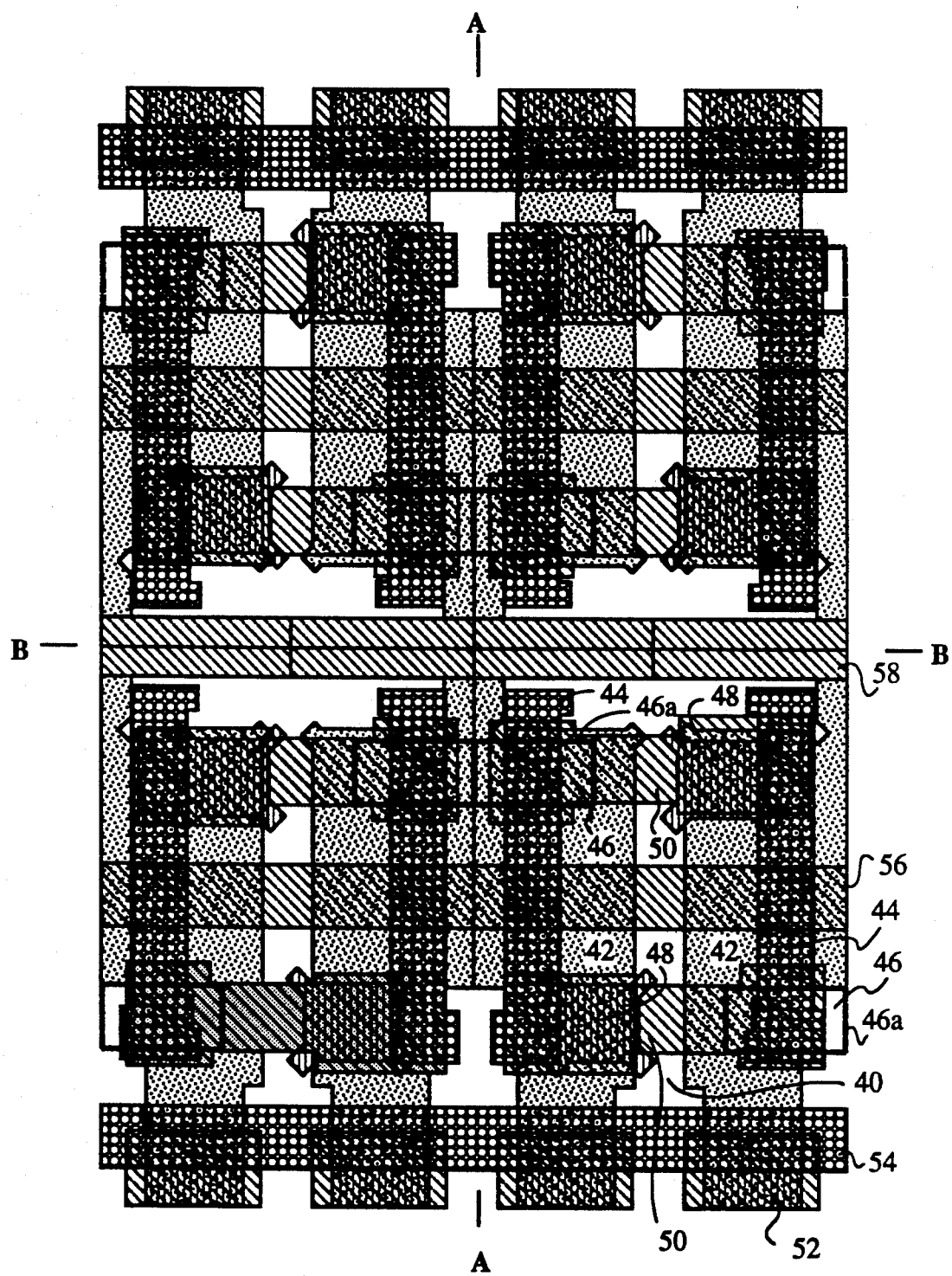
FIGS. 4a and 4b show in plan view the layout of a four cell CMOS 100 SRAM memory using this invention.
Figure 4B:
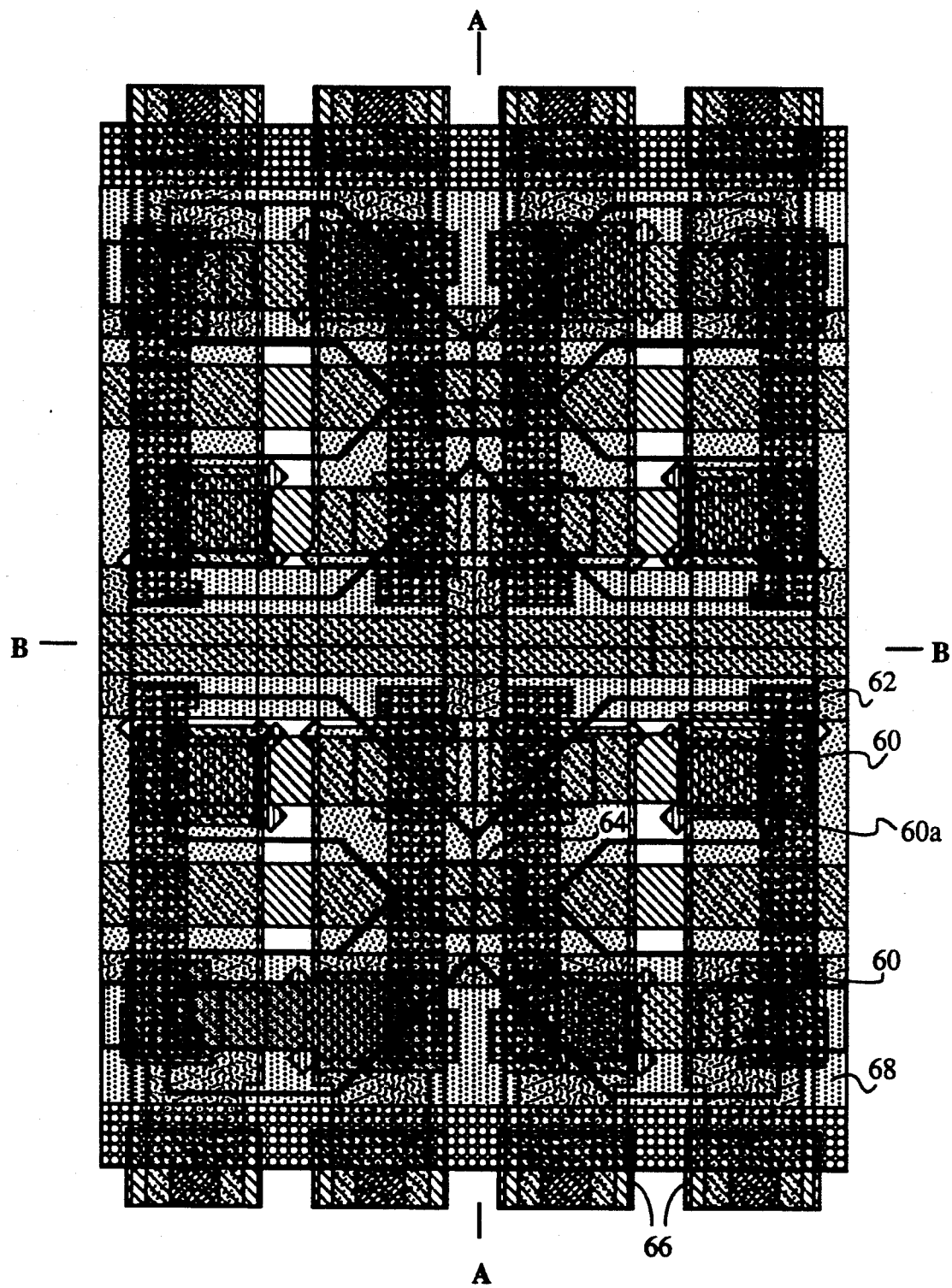

FIGS. 4a and 4b show the layout of a four cell CMOS 100 SRAM memory using this invention. A key illustrating which materials are symbolized by which shading types is also provided as FIG. 4c. Referring to FIG. 4a, which shows only some of the cell components for clarity, each cell occupies one quadrant as divided along lines A—A and B—B. The cell dimensions, only 6×9 microns, illustrate the small cell size achievable according to this invention. Reference numbers 40 and 42 indicate the field oxide and the island or active area, respectively. The two conductive gates 44 per cell are formed from the first deposited layer of polysilicon. Contacts 46 to the polysilicon gates 44 can be wider than the gates 44 themselves as indicated by the hash lines 46a. Buried contacts 48 open to the source and drain contact gate 44 by the process described above. To form the crosscoupled memory cell the circuit for which is shown as FIG. 2 in the above referenced U.S. patent application Ser. No. 07/464,094, each buried contact 48 is connected to a gate contact 46 via a conductive titanium silicide local interconnect structure 50. Other components of each cell include the bit line contact 52, the polysilicon word line 54, the silicided $V_{cc}$ 56 and the silicided ground line 58.

Additional cell components are illustrated in FIG. 4b. Load resistor vias 60 are located above a buried contact 48 and overlap a gate contact 46 as indicated by the hash lines 60a. The location of the load resistors 62 is indicated by a heavy line. A via 64 to the $V_{cc}$ line 56 is opened between two cells. Vertical heavy lines 66 and horizontal stripes of shading 68 show the location of connective metal lines formed by standard techniques.

Figure 4C:
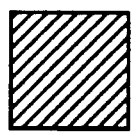
FIG. 4c is a key illustrating which shading types indicate which materials in FIGS. 4a and 4b.
Figure 4C:
Figure 4C:
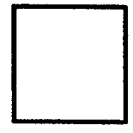
Figure 4C:
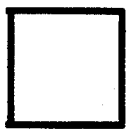
Figure 4C:
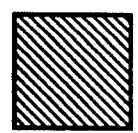
Figure 4C:
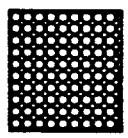
Figure 4C:
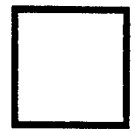
Figure 4C:
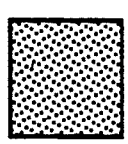
Figure 4C:
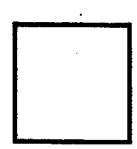

Referring to FIG. 4c, shading 70 indicates titanium silicide layers. Shading 71 indicates an island region. Shading 72 shows cell components formed of polysilicon by the first deposition of polysilicon. Hash lines 73 outline the borders of the polyisolation mask which opens the gate contact. Shading 74 indicates bit contacts. Hash lines 75 outline load resistor vias. Heavy lines 76 outline load resistors. Shading 77 indicates a contact region. Light lines 78 show metallic interconnects. Field oxide in FIGS. 4a and 4b is not shown with shading or outlines but occupies the white unmarked portions of the cell layout.

We claim:

1. A structure having a plurality of field effect transistors, each transistor comprising:
   a source region, a drain region, and a channel region separating said source region from said drain region, all formed in a semiconductor substrate;
   a gate formed of polycrystalline silicon and separated by insulation from and overlying said channel region, wherein said gate has formed on the top thereof a first layer of silicon dioxide insulation and a second layer which is a dielectric layer, said first layer of silicon dioxide overlying said source region or said drain region;
   a first opening formed in said first layer of silicon dioxide and said second dielectric layer on top of said gate thereby to allow electrical contact to be made to said gate through said opening, said first opening being formed by etching said first and second layers through a mask opening overlapping said source region or said drain region;
   an electrical contact to said gate formed in said first opening;
   wherein said electrical contact to said gate extends beyond said gate over said source region or said drain region without electrically contacting said source region or said drain region, so as to enable an interconnect to be formed immediately above said first and second layers such that said interconnect makes said electrical contact to said gate and passes over said source region or said drain region without electrically contacting said source region or said drain region.

2. The structure according to claim 1, further comprising:
   dielectric material covering the sides of said gate;
   a second opening formed in said first layer of silicon dioxide over said source region or said drain region, said second opening being formed by etching said first layer through a mask opening overlapping said gate; and
   an electrical contact, to said source region or said drain region, in said second opening which contact is spaced from said electrical contact to said gate and which is enabled to overlap said gate but is prevented from electrically contacting said gate by said dielectric material and said second dielectric layer.

3. A structure as in claim 2 wherein said dielectric material covering the sides of said gate is silicon dioxide which is thick compared to the insulation between said gate and said channel region.

4. A structure as in claim 3 wherein said second dielectric layer is silicon nitride.

5. The structure according to claim 2 wherein the portion of said gate exposed by said first opening and the portion of said source region or said drain region exposed by said second opening is covered by protective conductive material before electrical contact to said gate is made through said first opening and electrical contact to said source region or said drain region is made through said second opening.

6. The structure according to claim 5 wherein said protective conductive material is titanium silicide covered by a thin film of titanium nitride.

7. The structure according to claim 6 wherein selected ones of said plurality of field effect transistors are electrically interconnected by conductive interconnects to form a selected circuit.

8. The structure according to claim 7 wherein said conductive interconnects are at least partly formed of titanium silicide.

9. The structure according to claim 8 wherein said conductive interconnects are at least partly covered by titanium nitride.

10. The structure according to claim 8 wherein said conductive interconnects are essentially completely formed of titanium silicide.

11. The structure of claim 1 wherein said first layer of silicon dioxide is formed by chemical vapor deposition and is at least 500 Å thick.

12. A semiconductor structure in an integrated circuit, said structure comprising:

a first field effect transistor having an electrode S1, an electrode D1 laterally spaced from said electrode S1 by a channel region, and a gate G1 above and insulated from said channel region but between said electrodes S1 and D1;

an insulator overlying said gate G1 and said electrode S1 or D1;

a first terminal spaced from said electrode S1 and said gate G1; and a first opening formed in said insulator so as to allow electrical contact to be made to said gate G1 through said first opening, said first opening being formed by etching said insulator through a mask opening which extends beyond said gate G1 over said electrode S1 or D1 but said first opening not allowing electrical contact to be made to said electrode S1 or D1 through said first opening, so as to enable a first interconnect to be formed immediately above said insulator for electrically connecting said gate G1 to said first terminal, said first interconnect electrically contacting said gate G1 through said first opening, said first interconnect passing over said electrode S1 or D1 but being separated from said electrode S1 or D1 by said insulator.

13. The structure of claim 12 further comprising said first interconnect.

14. The structure of claim 12 further comprising a second opening in said insulator so as to allow electrical contact to be made to a selected one of said electrodes S1 and D1 through said second opening, said second opening being formed by etching said insulator through a mask opening which overlaps said gate G1 but said second opening not allowing electrical contact to be made to said gate G1 through said second opening, so as to enable a second interconnect to be formed immediately above said insulator for electrically connecting said selected electrode to a terminal spaced from said selected electrode and from said gate G1, said second interconnect being spaced from said first interconnect, said second interconnect electrically contacting said selected electrode through said second opening, said second interconnect being separated from said gate G1 by said insulator.

15. The structure of claim 14 further comprising said first and second interconnects.

16. The structure of claim 14 wherein:
said electrodes S1 and D1 are disposed in a semiconductor substrate; and
said gate G1 is above said semiconductor substrate, and said gate G1 is spaced and insulated from said semiconductor substrate.

17. The structure of claim 12 wherein said insulator comprises an insulating layer overlying said electrode S1, said insulating layer being formed by chemical vapor deposition.

18. The structure of claim 17 wherein said insulating layer is at least 500 Å thick.

19. The structure of claim 12 further comprising a second field effect transistor comprising a current carrying electrode S2, a current carrying electrode D2 laterally spaced from said electrode S2, and a gate G2 at least part of which is above but between said electrodes S2 and D2, wherein said electrode S2 or D2 provides said first terminal;
wherein said insulator overlies said gate G2 and said electrode S2 or D2; and
wherein said structure further comprises a second opening formed in said insulator so as to enable said first interconnect to electrically contact said first terminal through said second opening, said second opening being formed by etching said insulator through a mask opening overlapping said gate G2 but said second opening not allowing electrical contact to be made to said gate G2 through said second opening.

20. The structure of claim 19 wherein:
said electrodes S1, S2, D1 and D2 are formed in a semiconductor substrate; and
said gates G1 and G2 are above said semiconductor substrate.

21. The structure of claim 17 wherein:
said insulator comprises an insulating layer that overlies said electrodes S1 or D1 and S2 or D2 and said gates G1 and G2; and
each of said first and second openings comprises an opening through said insulating layer.

22. The structure of claim 12 wherein said electrode S1 or D1 comprises:
a first edge adjacent said gate G1; and
a second edge laterally spaced from said first edge; and
wherein said first interconnect is enabled to cross over said electrode S1 or D1 from over said first edge to over said second edge.

23. The structure of claim 12 wherein said insulator comprises:
a first portion on top of said gate G1; and
spacers on sidewalls of said gate G1 and of said first portion.

24. A semiconductor structure formed in an integrated circuit and comprising:
a first semiconductor structure comprising: p2 a semiconductor substrate;
first and second conductive regions in said substrate which regions form, respectively, a source and a drain of a field effect transistor; and
a third semiconductor region extending from said first region to said second region and forming a channel region of said transistor;
a contiguous conductive layer overlying said first semiconductor structure and having a portion that forms a gate of said transistor;
an insulator overlying said contiguous layer and said first semiconductor structure; and
an opening in said insulator so as to allow electrical contact to be made to said contiguous layer through said opening, said opening being formed by etching said insulator through a mask opening overlying said contiguous layer, said mask opening extending beyond said contiguous layer and over said first structure, said opening in said insulator not allowing electrical contact to be made therethrough to said first structure.

25. The structure of claim 24 wherein said opening to said insulator overlies said gate portion of said contiguous layer.

* * * * *

UNITED STATES PATENT AND TRADEMARK OFFICE
CERTIFICATE OF CORRECTION

PATENT NO. : 5,166,771
DATED : November 24, 1992
INVENTOR(S) : Godinho et al.

It is certified that error appears in the above-indentified patent and that said Letters Patent is hereby corrected as shown below:

Col. 10, line 19, "17" should be --19--.

Signed and Sealed this

Twentieth Day of December, 1994

Attest:

BRUCE LEHMAN

*Attesting Officer*  *Commissioner of Patents and Trademarks*